`US005477161A`

United States Patent [19]
Kardos et al.

[11] Patent Number: 5,477,161
[45] Date of Patent: Dec. 19, 1995

[54] TEST ADAPTER FOR PACKAGED INTEGRATED CIRCUITS

[75] Inventors: Gabor Kardos; Norma J. Kardos, both of Sunnyvale, Calif.

[73] Assignee: Emulation Technology, Inc., Santa Clara, Calif.

[21] Appl. No.: 375,051

[22] Filed: Jan. 18, 1995

Related U.S. Application Data

[63] Continuation of Ser. No. 79,721, Jun. 18, 1993, abandoned.

[51] Int. Cl.⁶ ..................................................... G01R 01/02
[52] U.S. Cl. ........................... 324/755; 324/537; 324/754; 324/756; 324/757; 324/758; 439/73; 439/264; 439/885
[58] Field of Search .................. 439/70, 71, 73, 439/263, 264, 265, 269, 912, 885, 75; 324/537, 754, 756, 757, 758, 755

[56] References Cited

U.S. PATENT DOCUMENTS

| | | | |
|---|---|---|---|
| 3,205,406 | 9/1965 | Pick | 439/912 |
| 3,968,433 | 7/1976 | Dobarganes. | |
| 4,012,097 | 3/1977 | Long et al.. | |
| 4,112,363 | 9/1978 | Morrison | 324/158 P |
| 4,340,860 | 7/1982 | Teeple | 324/158 P |
| 4,541,676 | 9/1985 | Hansen et al.. | |
| 4,671,590 | 6/1987 | Ignasiak. | |
| 4,671,592 | 6/1987 | Ignasiak et al.. | |
| 4,735,580 | 4/1988 | Hansen et al.. | |
| 4,797,118 | 1/1989 | Feamster. | |
| 4,801,273 | 1/1989 | Ikekya | 439/264 |
| 4,816,751 | 3/1989 | Seiichi et al.. | |
| 4,833,404 | 5/1989 | Meyer et al.. | |
| 4,835,469 | 5/1989 | Jones | 324/158 P |
| 4,936,783 | 6/1990 | Peterson | 439/70 |
| 4,996,476 | 2/1991 | Balyasny et al.. | |
| 5,151,651 | 9/1992 | Shibata | 324/158 P |
| 5,159,266 | 10/1992 | Appolo | 324/158 P |
| 5,177,436 | 1/1993 | Lee | 324/158 P |
| 5,186,641 | 2/1993 | Uratsuji | 439/70 |

*Primary Examiner*—Kenneth A. Wieder
*Assistant Examiner*—Mark Wardas
*Attorney, Agent, or Firm*—Skjerven, Morrill, MacPherson, Franklin & Friel; Brian D. Ogonowsky

[57] ABSTRACT

A test clip, or test adapter, is provided for connecting leads of a tester to terminals on a packaged integrated circuit. Spacers on the test clip, which act to precisely separate the contact pins, are formed separately using a stamping process. Spacers may be formed having a thickness which can be controlled to approximately one mil. Each of the individual spacers is sandwiched between two contact pins to provide precise spacing of the contact pins. A bar is inserted through a hole in each of the spacers and contact pins to form a linear array of contact pins and spacers. Two or four (as appropriate) of the linear arrays of contact pins/spacers are then mounted on a test clip body sized for a specific integrated circuit package. Each of the spacers may include an L-shaped extension which is urged under the integrated circuit package when the test clip is pressed onto the package so as to firmly secure the test clip to the package.

21 Claims, 16 Drawing Sheets

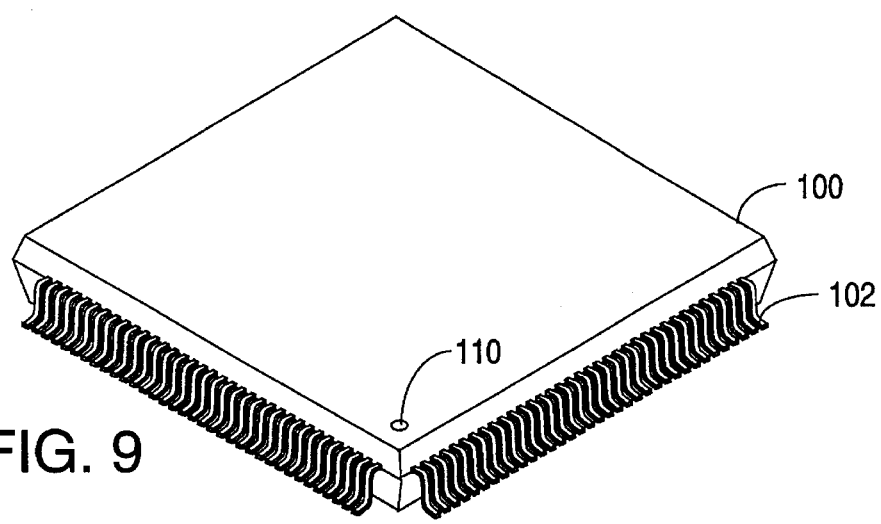
FIG. 9
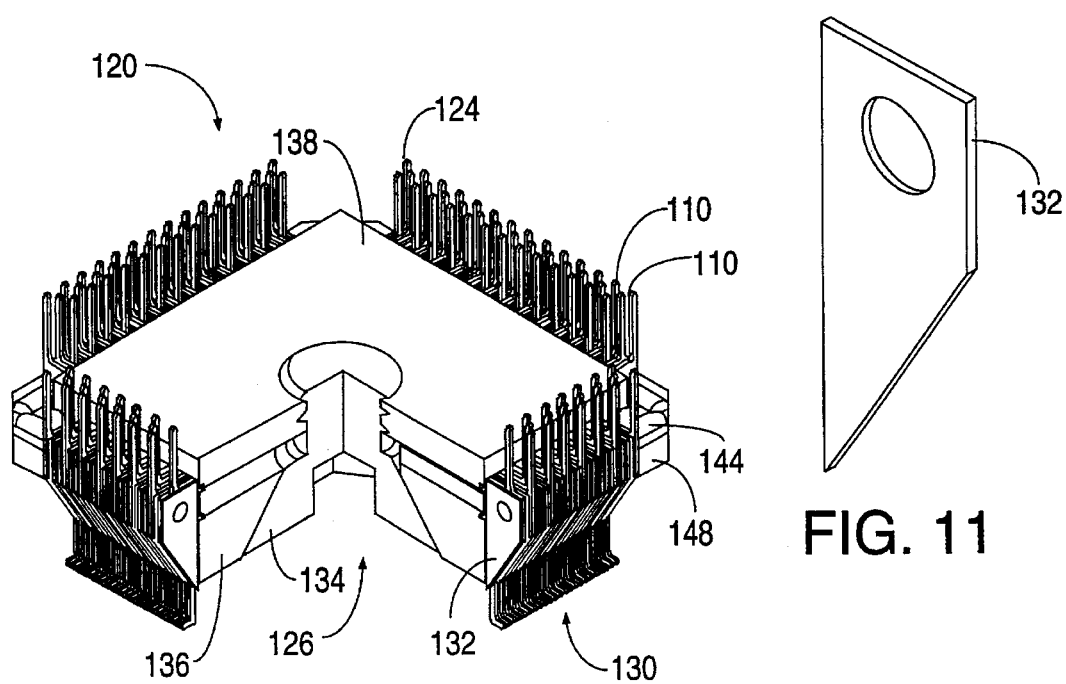
FIG. 10
FIG. 11
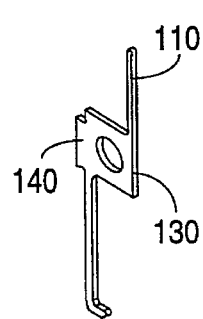
FIG. 12a
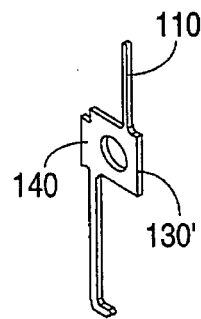
FIG. 12b
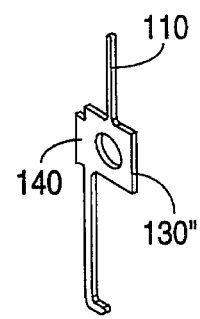
FIG. 12c

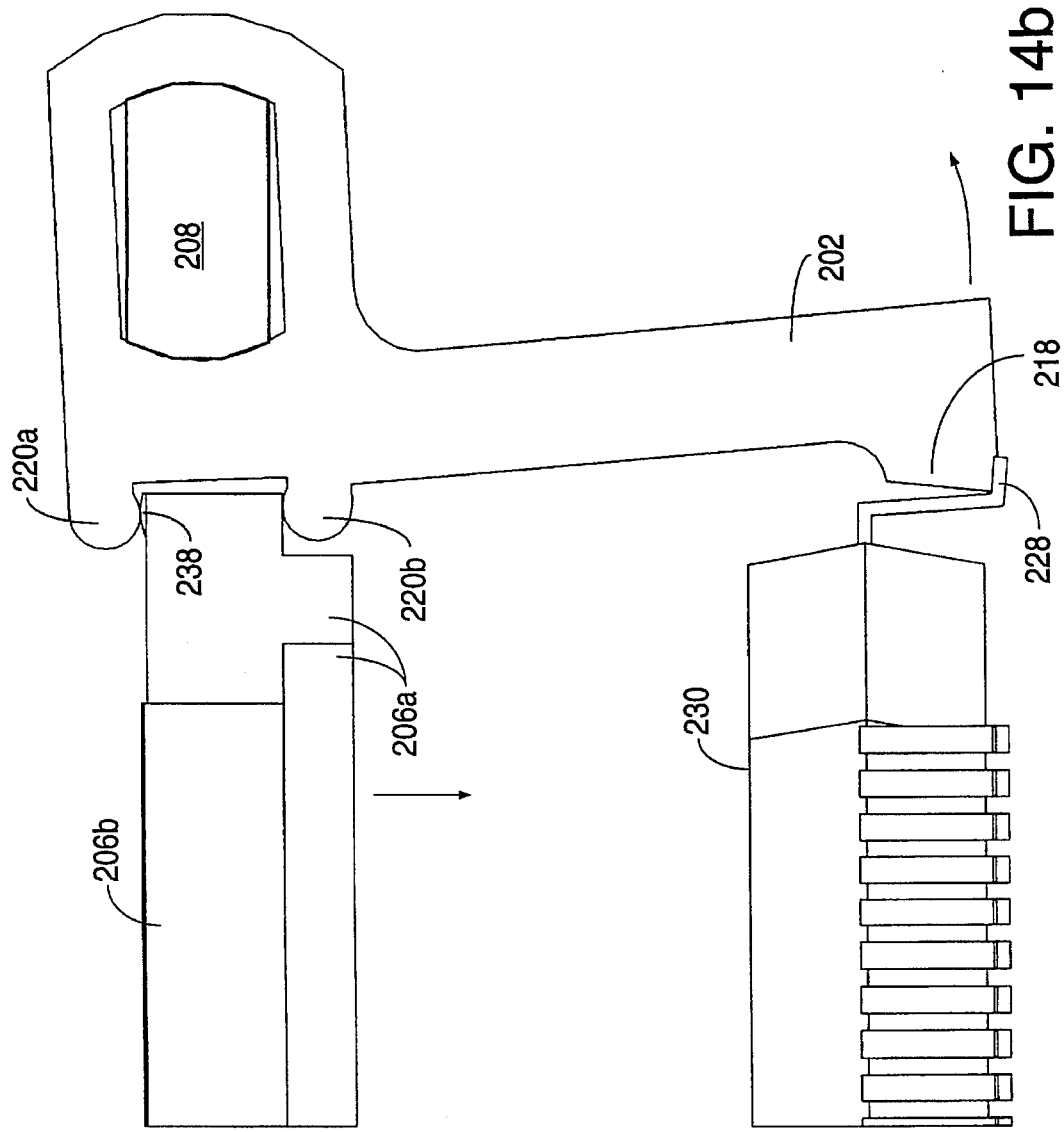

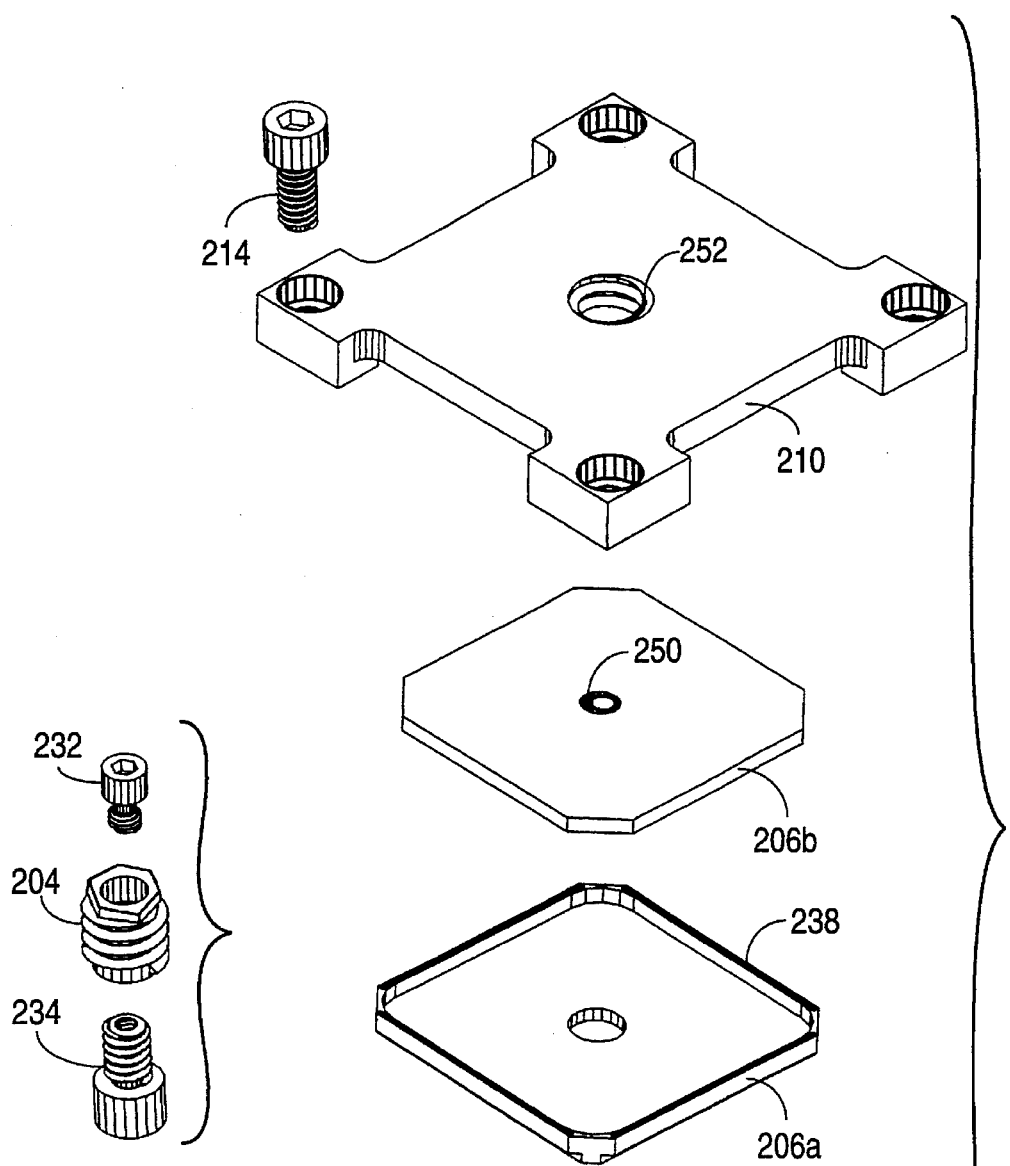
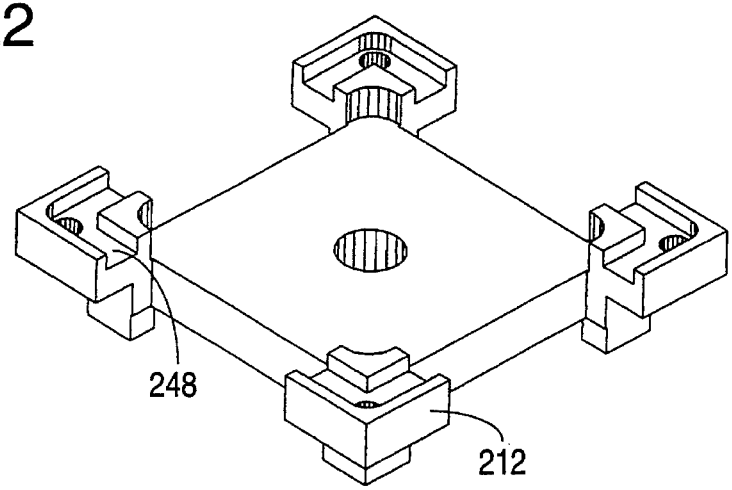
FIG. 22
FIG. 21

TEST ADAPTER FOR PACKAGED INTEGRATED CIRCUITS

This application is a continuation of application Ser. No. 08/079,721, filed Jun. 18, 1993, now abandoned.

FIELD OF THE INVENTION

This invention generally relates to passive test adapters for connecting leads of a tester to the terminals of a packaged integrated circuit or to the bonding pads of a printed circuit board.

BACKGROUND OF THE INVENTION

There exists a wide variety of test clips, or test adapters, for packaged integrated circuits. Generally, these test clips are constructed to contact the terminals of a packaged integrated circuit which has been mounted on a circuit board. In this way, the integrated circuit may be tested while operating in its intended electrical environment.

Contact pins on the test clips are arranged to match the terminal footprint pattern of the packaged integrated circuit. The test clips must reliably contact each of the terminals of the integrated circuit and be firmly affixed to the integrated circuit during the testing.

Typically, these test clips have a separate set of connectors which are to be connected to a tester. In this way, the test clips act as an interface between the integrated circuit terminals and the tester leads.

These test clips are typically formed of plastic which is injection molded to define the body of the test clip, which includes the spacers used to separate and align the test clip contact pins.

Problems with prior art test clips include the fact that the contact pins on the test clip which contact the terminals of the integrated circuit have a limited minimum pitch due to the limited minimum pitch of the injection molded spacers. Generally, spacers having a pitch of less than 0.5 mm cannot be reliably formed using injection molding. As terminals on packaged integrated circuits are being formed to have smaller and smaller pitches, the present state of the art test clips are inadequate for these finer pitches.

Accordingly, a radical new technique for spacing the contact pins on a test clip is required to meet the needs of the industry.

Another problem with conventional test clips is that they do not securely attach to the integrated circuit package, so that the electrical contact between the test clip and the terminals of the integrated circuit is unreliable. Typically, prior art test clips rely on friction between the test clip contact pins and the terminals of the integrated circuit to maintain a grip on the integrated circuit package.

Accordingly, what is also needed is an improved means for securing a test clip to a packaged integrated circuit.

SUMMARY OF THE INVENTION

A test clip, or test adapter, is provided for connecting leads of a tester to terminals on a packaged integrated circuit. Spacers on the test clip, which act to precisely space the contact pins, are not injection molded as part of the test clip body but are formed separately using a conventional stamping process. Such spacers may be formed to any thickness, which can be accurately controlled to approximately one mil.

Each of the individual spacers is sandwiched between two contact pins to provide precise spacing of the contact pins. A bar is inserted through a hole in each of the spacers and contact pins to form a linear array of contact pins and spacers. Two or four (as appropriate) of the linear arrays of contact pins/spacers are then mounted on a test clip body sized for a specific integrated circuit package. The length of the linear arrays and the thicknesses of the spacers may be different for each size test clip body.

When the test clip is now pressed over an integrated circuit package, the contact pins will be precisely aligned with the terminals of the package.

Forming the linear arrays of contact pins and spacers separate from the test clip body simplifies the assembly process and enables fabricating test clips having customized contact pin spacings without any retooling. For non-standard contact pin spacings, a combination of two or more spacers between adjacent contact pins may be used.

Additionally, each of the spacers may include an L-shaped extension which is urged under the integrated circuit package when the test clip is fitted onto the package so as to firmly secure the test clip to the package without using excessive friction. This also enables the test clip to be removed from the package simply by releasing the spacers from the package and gently lifting off the test clip from the package.

Other features of the invention will be described in detail with respect to the preferred embodiments shown in the drawings.

BRIEF DESCRIPTION OF THE DRAWINGS

FIG. 9 illustrates a surface mounted integrated circuit package.

FIG. 10 illustrates a second embodiment test adapter which is specifically designed for connection to a certain bonding pad pattern on a printed circuit board.

FIG. 11 is an isometric view of a spacer used in the embodiment of FIG. 10.

3

FIGS. 12a, 12b, and 12c are isometric views of contact pins for use with the test adapter of FIG. 10.

Figure 13:
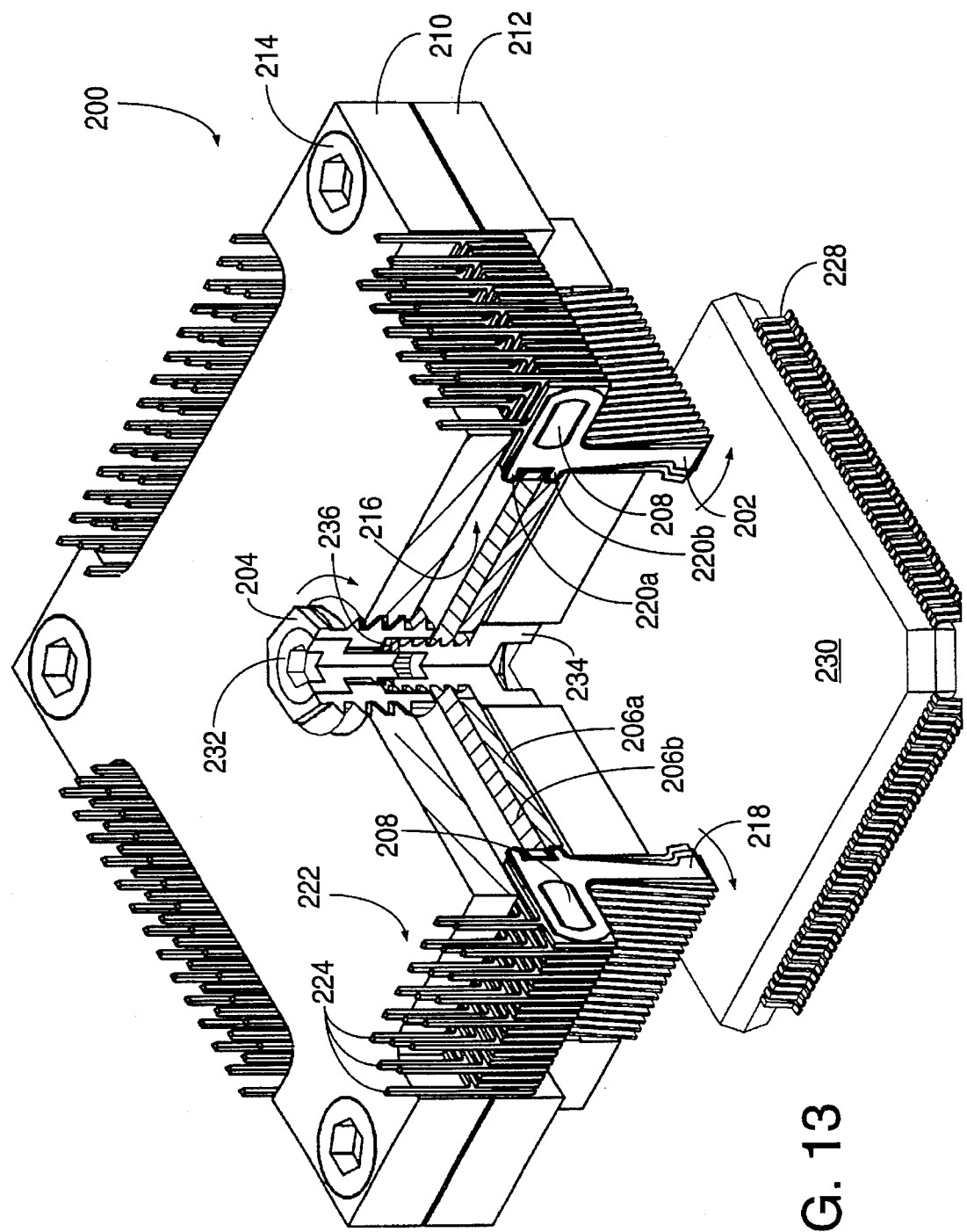

FIG. 13 is a partially cut away isometric view of another embodiment of a test clip for interfacing the terminals of an integrated circuit package with leads of a tester.

Figure 14A:
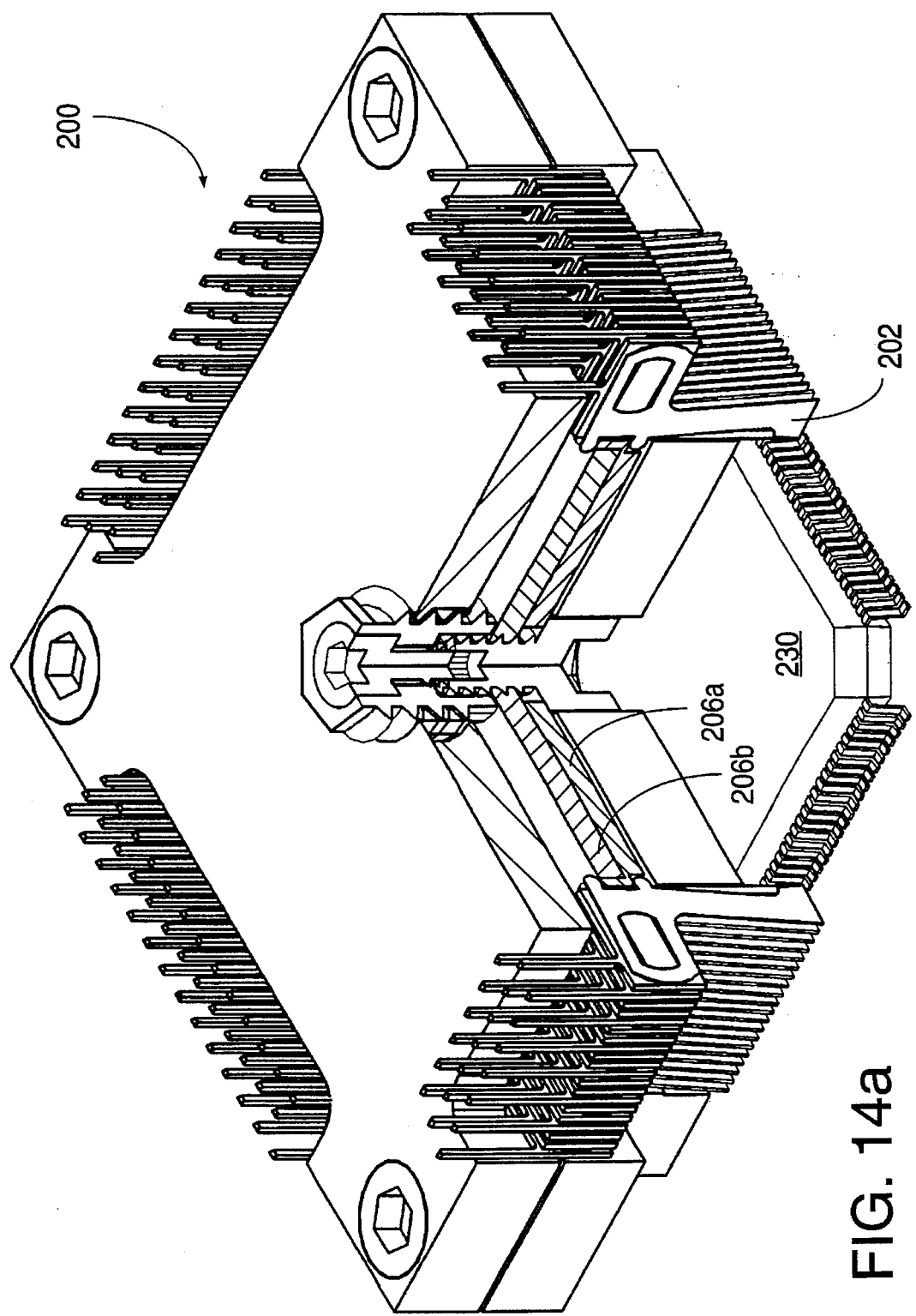

FIG. 14a is an isometric view of the test clip of FIG. 13 positioned over an integrated circuit package prior to the test clip being secured thereto.

FIG. 14b is a close-up side view of the cut away portion of FIG. 14a illustrating the interaction of a spacer with a side of the packaged integrated circuit.

Figure 15A:
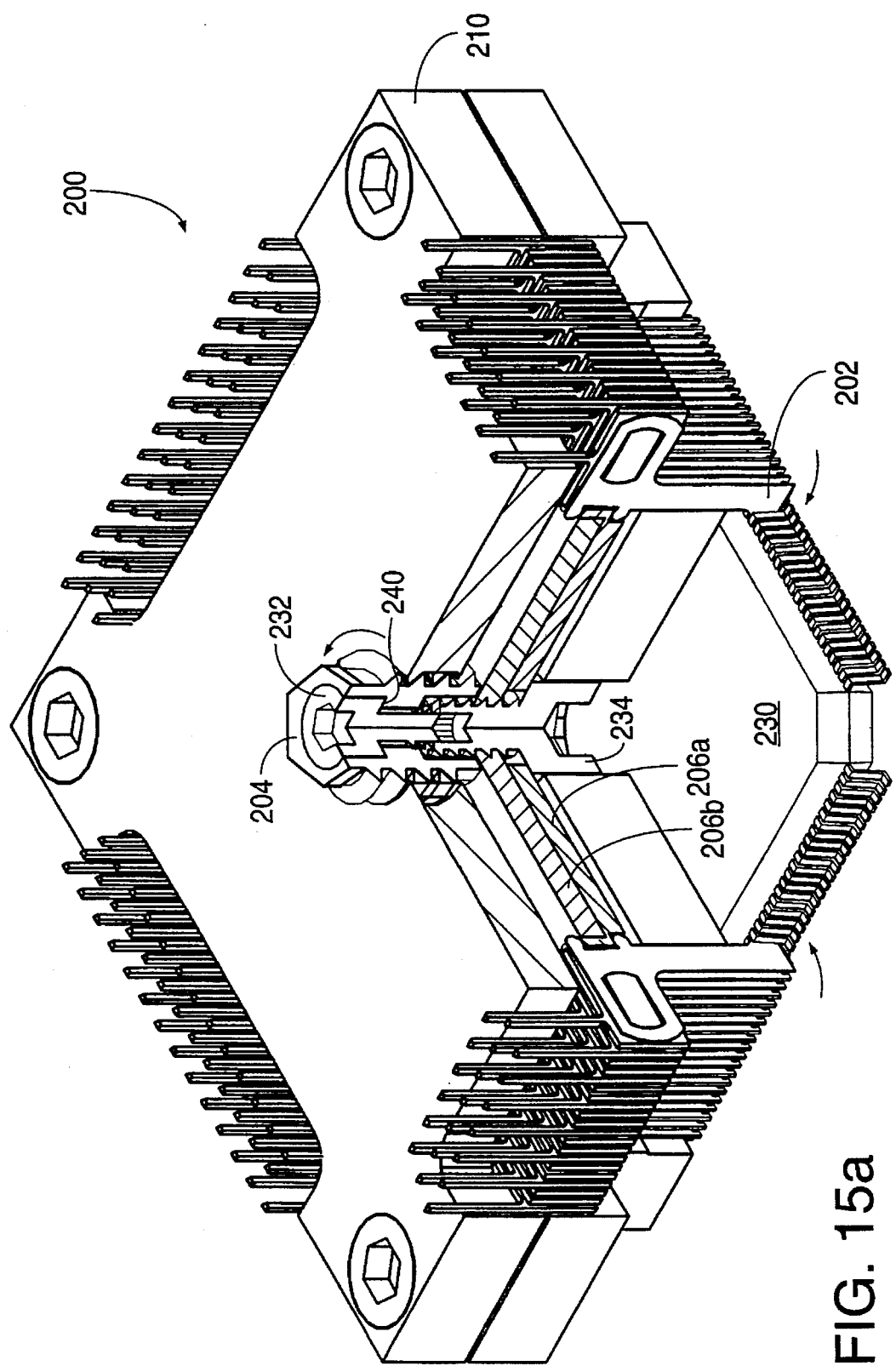

FIG. 15a is an isometric view of the test clip of FIG. 14a now secured to the underlying integrated circuit package.

Figure 15B:
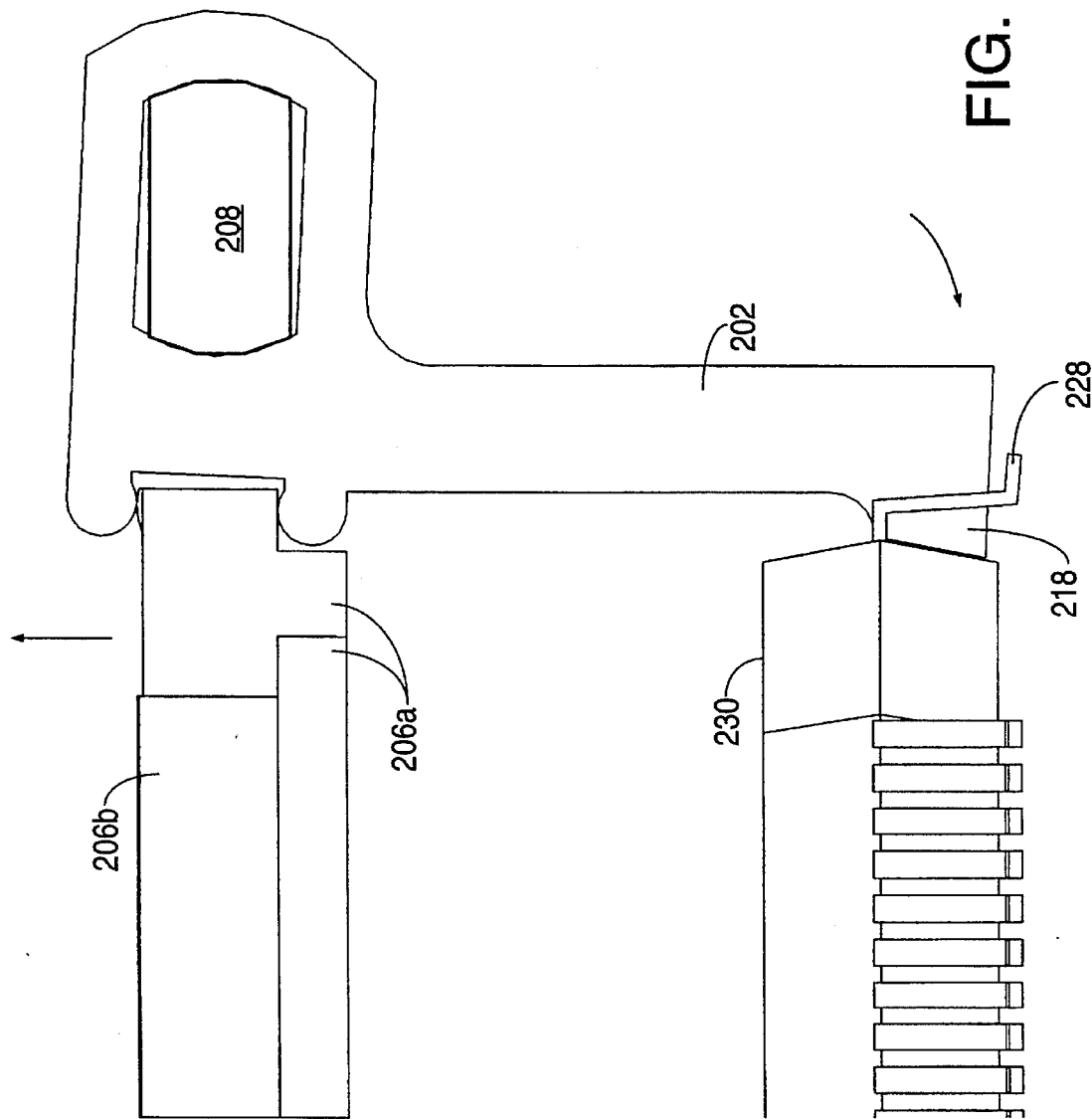

FIG. 15b is a close-up side view of the cut away portion of FIG. 15a illustrating the interaction of a spacer with a side of the integrated circuit package.

Figure 16:
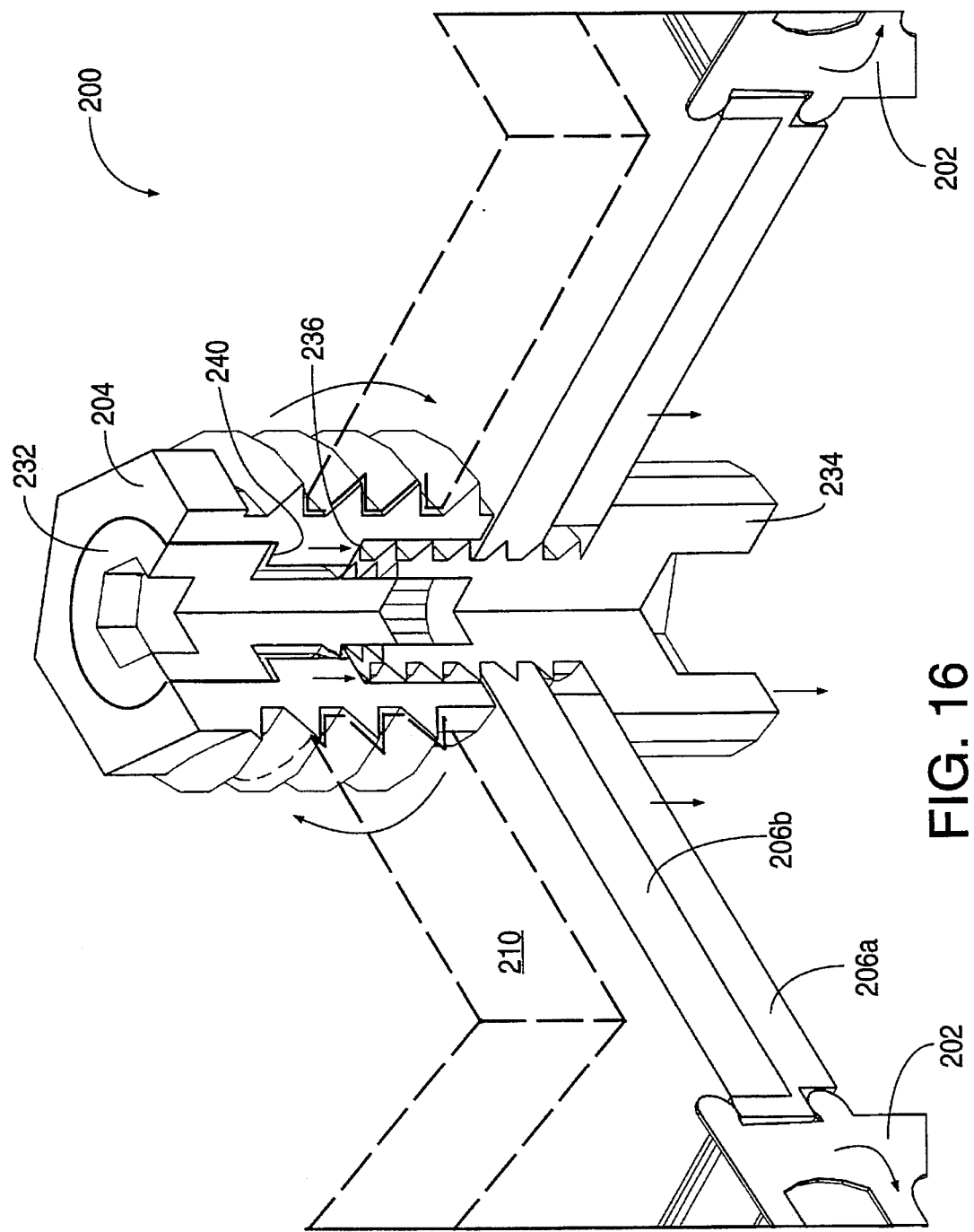

FIG. 16 is a close-up, partially cut away isometric view of a portion of the test clip of FIG. 13 illustrating the clamping mechanism used for pivoting the spacers.

Figure 17:
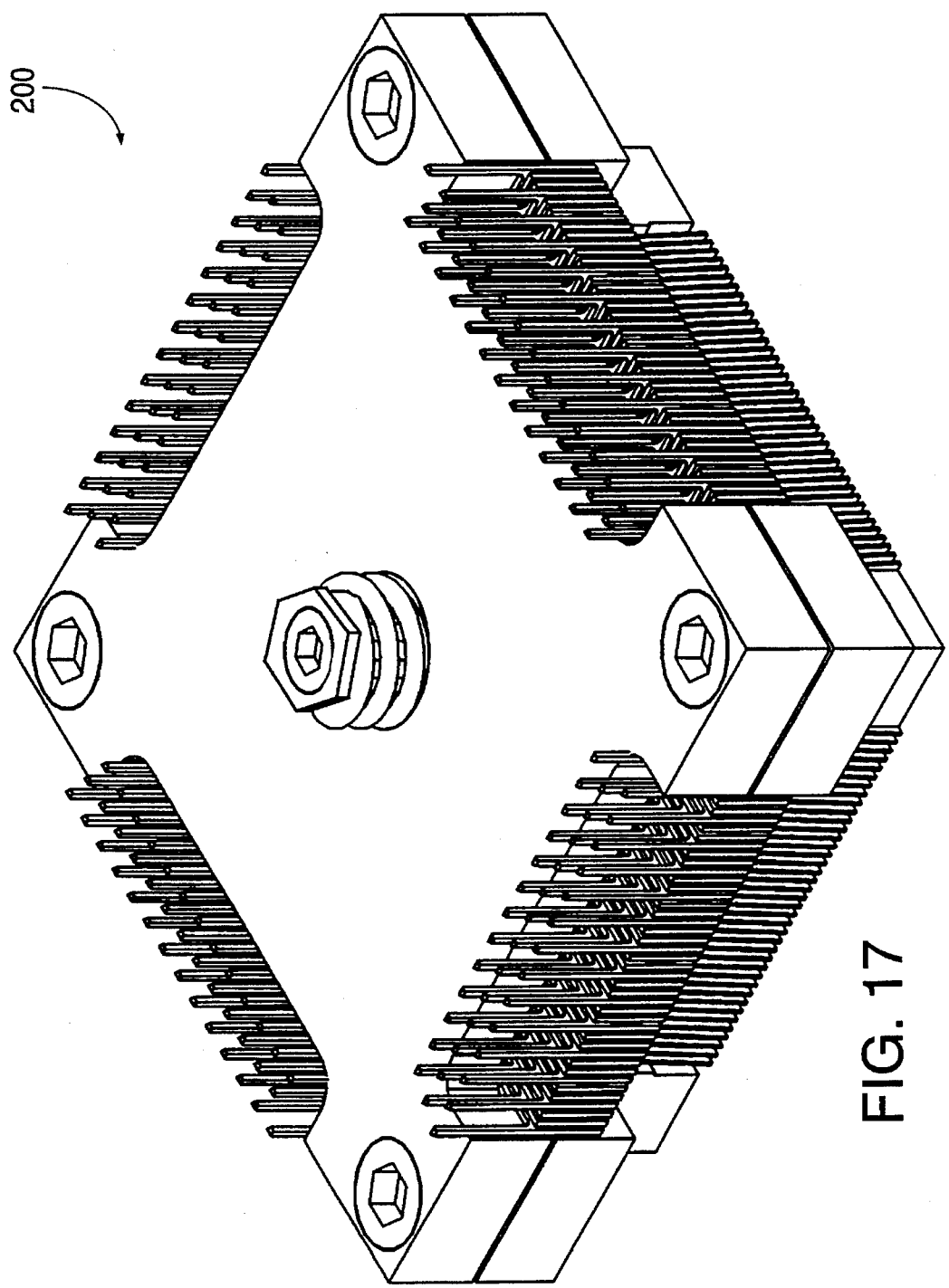

FIG. 17 is an isometric view of the test clip of FIG. 13 without any cut away portions.

Figure 18:
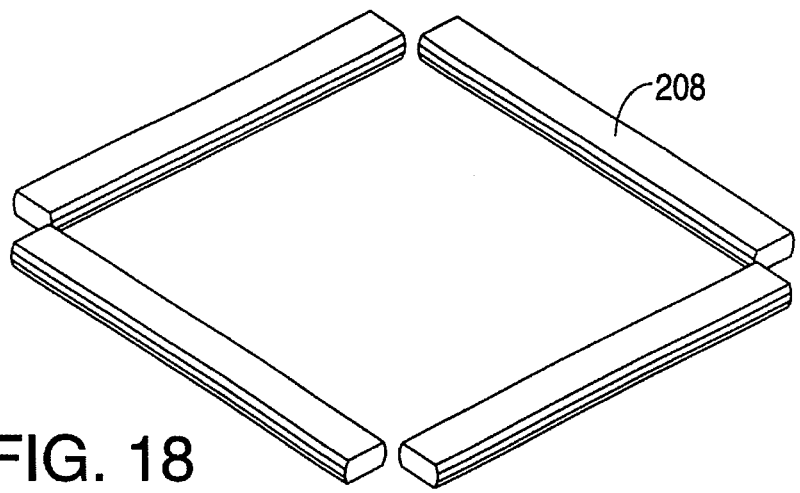

FIG. 18 illustrates four separate bars which are used to support the spacers and contact pins in the embodiment of FIG. 13.

Figure 19A:
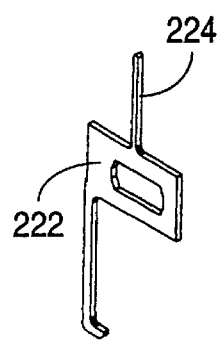
Figure 19B:
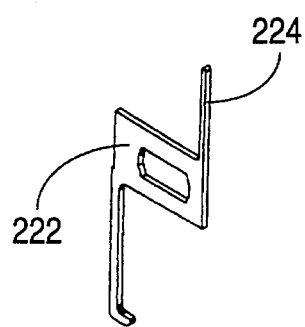
Figure 19C:
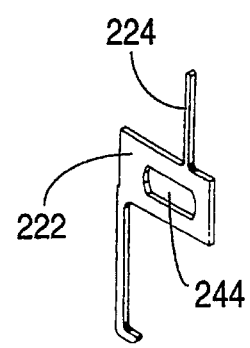

FIGS. 19a, 19b, and 19c illustrate three designs of contact pins used in the embodiment of FIG. 13 and supported by the bars shown in FIG. 18.

Figure 20:
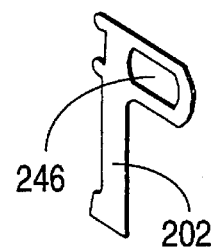

FIG. 20 illustrates one embodiment of an insulating spacer used in the embodiment of FIG. 13 and supported by the bars in FIG. 18.

FIG. 21 is an exploded view illustrating the various pieces which are used to form the body of the test clip of FIG. 13.

FIG. 22 illustrates the three screws which are used to change the angle of the spacers to clamp onto an integrated circuit package.

Figure 23:
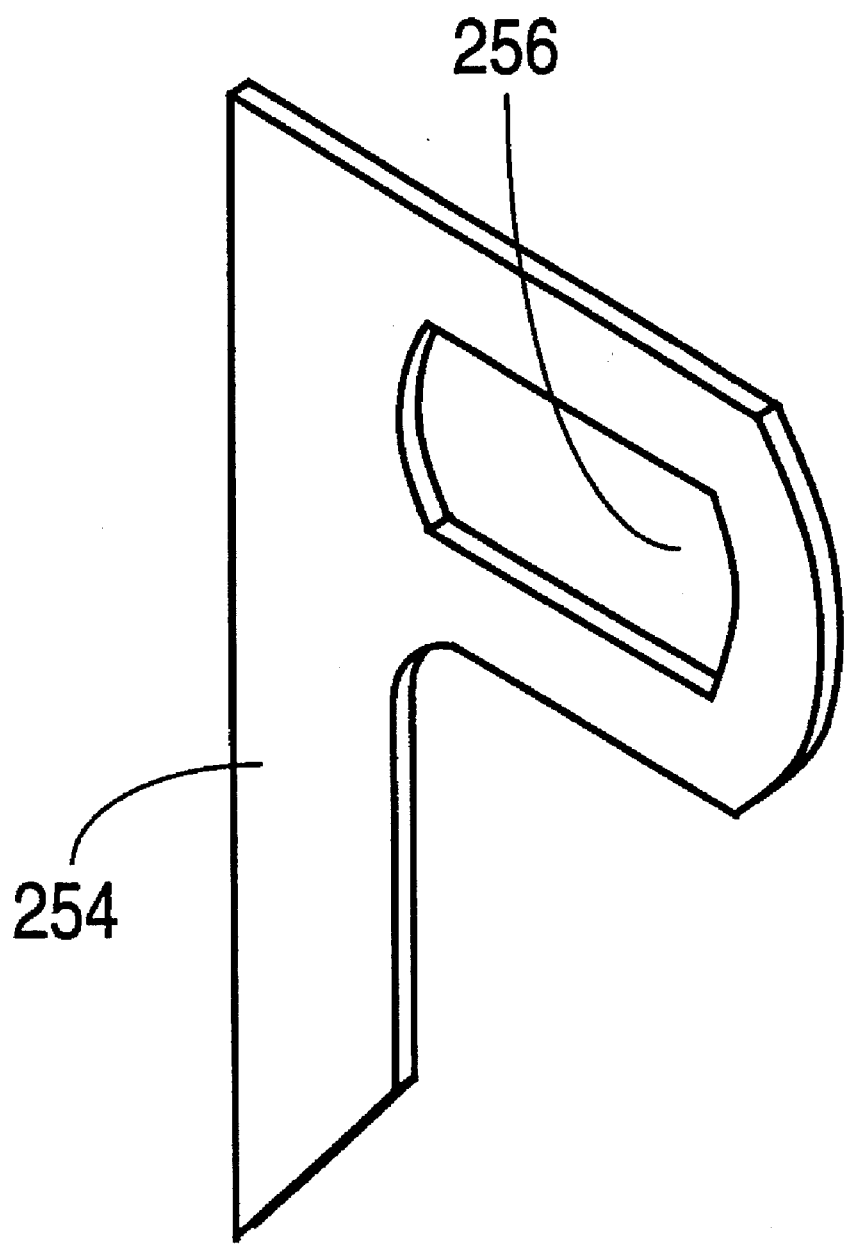

FIG. 23 illustrates an insulating spacer used in a surface mounted test adapter whose contact pins are directly soldered onto a printed circuit board.

DETAILED DESCRIPTION OF THE PREFERRED EMBODIMENTS

Figure 1:
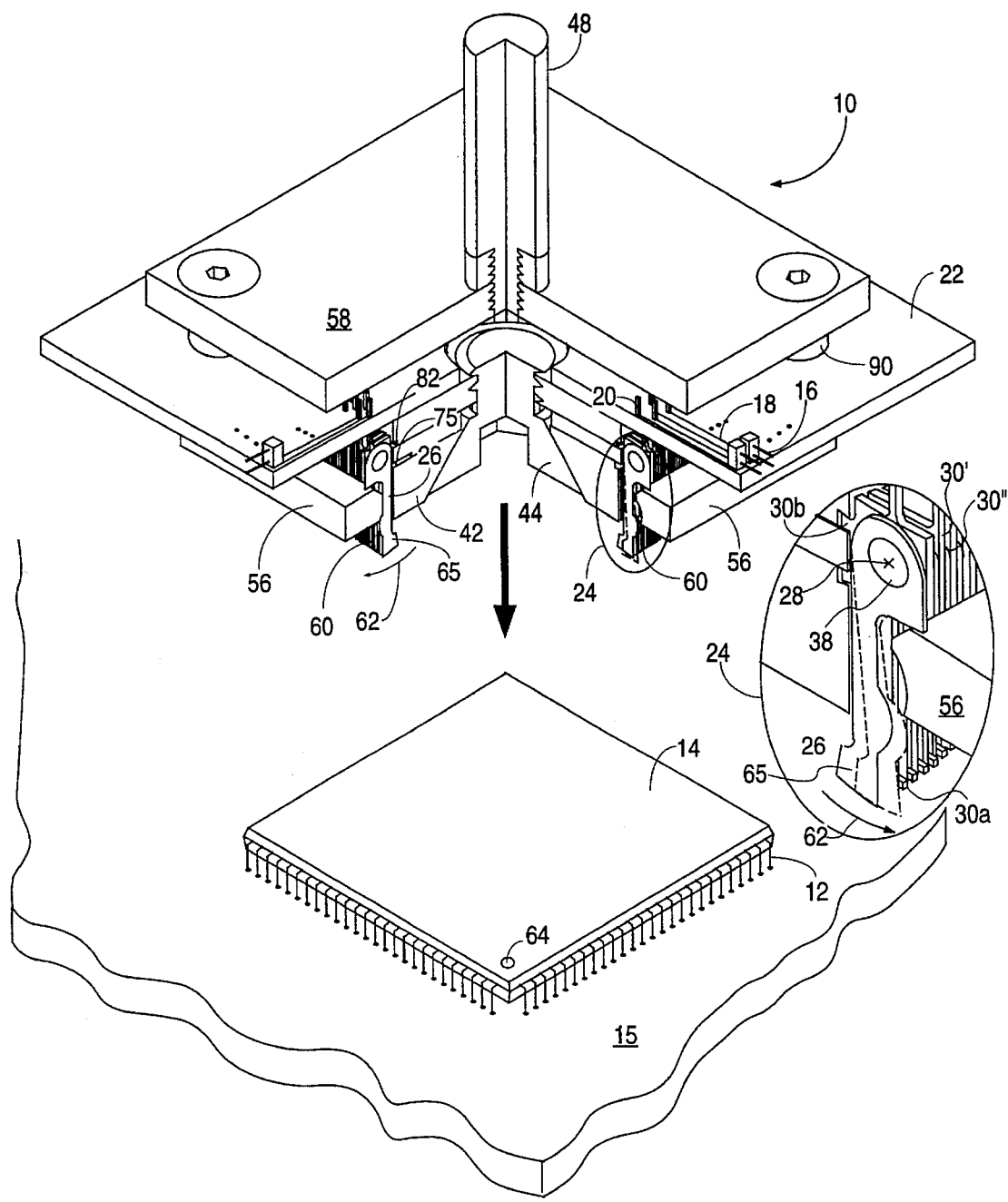
FIG. 1 is an isometric view of a standard integrated circuit package mounted on a printed circuit board and a partially cut away view of one embodiment of a test clip for interfacing the terminals of the integrated circuit package with leads of a tester.

FIG. 1 shows a partially cut away embodiment of a test clip 10 which is to be used as an adapter or interface between the pins 12 of an integrated circuit package 14 and a tester (not shown). Integrated circuit package 14 is mounted on a conventional circuit board 15 so as to be connected in its intended electrical operating environment.

A standard female type connector (not shown), leading to the tester, is used to make electrical contact to pins 16 formed around the periphery of test clip 10. Typically, this standard female connector is connected to the tester using a suitable array of wires, such as a ribbon wire. Although only a few of pins 16 on test clip 10 are shown for simplicity, there would be at least the same number of pins 16 as there are pins 12 on the integrated circuit package 14.

Pins 16 are electrically connected, using conductive traces 18 or other suitable conductive means, to metal posts 20 extending from the test clip contact pins (to be described later). Traces 18 are formed on an insulating board 22, which may be made formed of plastic, resin, or any other insulating material. Posts 20 extend through holes formed in board 22.

The area within oval 24, showing spacers and contact pins, is enlarged for clarity.

4

Figure 3:
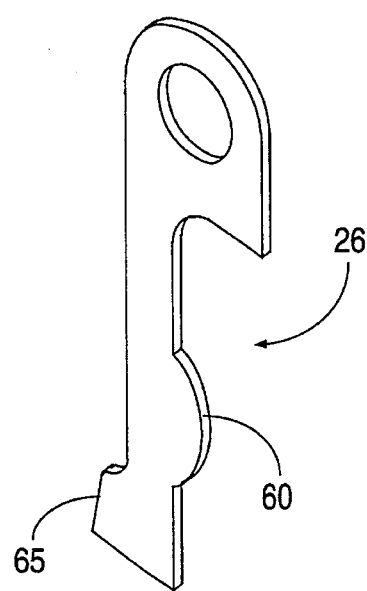
FIG. 3 is an isometric view of a single spacer used in the structure of FIG. 1.

The detail within oval 24 illustrates an exposed insulating spacer 26, which is preferably formed of plastic. Additional detail of a single spacer 26 is shown in FIG. 3. In one embodiment, the total height of spacer 26 is approximately 10 mm, and spacer 26 has a width at its top portion of approximately 3 mm. The thickness of spacer 26 is totally dependent upon the required separation between adjacent contact pins 30 for a particular integrated circuit package 14.

These spacers 26 are not injection molded as part of the test clip body but are formed by stamping out the spacers 26 from a flat sheet of any thickness. Water cutting may be used instead of stamping. Since the thickness of the flat sheet is easily controlled within one mil, spacers 26 may be formed to have virtually any thickness. In a preferred embodiment, the plastic sheets from which spacers 26 are stamped are manufactured by Argus Corporation and have a melting temperature exceeding approximately 250° C. so that spacers 26 will not melt at soldering temperatures.

Spacer 26 within oval 24 is shown with a ghost outline to illustrate a certain degree of rotational play around axis 28.

Shown abutting spacer 26 within oval 24 is a test clip contact pin 30, which is a unitary piece of conductive metal, such as beryllium copper or phosphor bronze. The beryllium copper may be plated with a layer of nickel and an outer layer of gold to prevent oxidation and to add any selected thickness to the beryllium copper base. In one embodiment, the contact pins 30 are formed by a conventional chemical etch. Each contact pin 30 has a resilient, lower contact portion 30a and an upper body portion 30b which includes post 20.

Figure 4A:
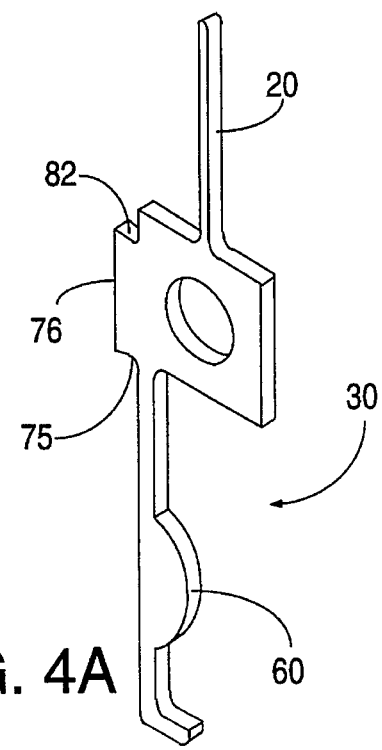
FIGS. 4a, 4b, and 4c illustrate three configurations of contact pins which are used in the structure of FIG. 1.
Figure 4B:
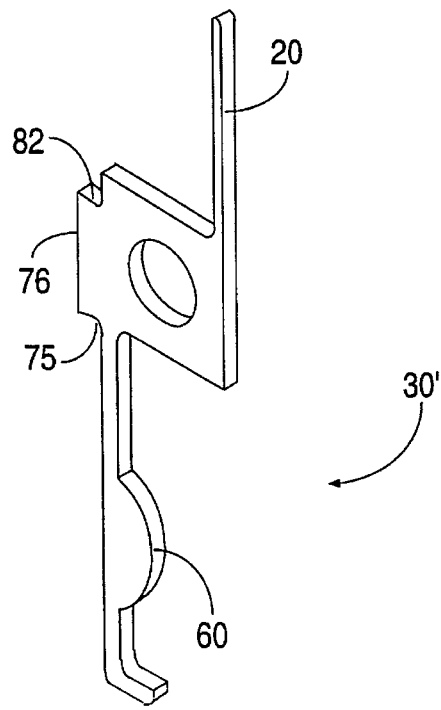
Figure 4C:
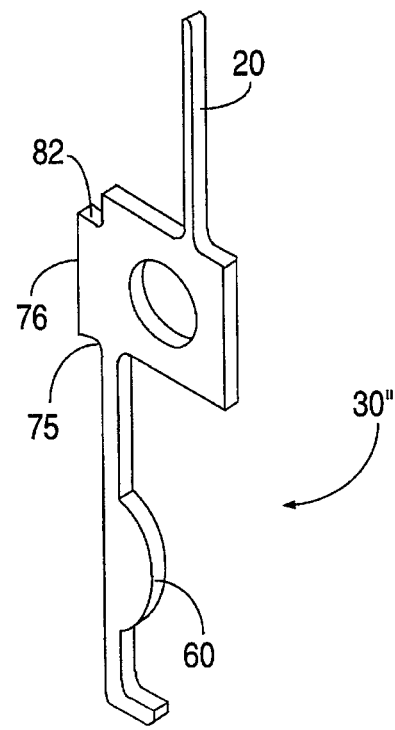

Within oval 24 is shown three types of contact pins: 30, 30' and 30", which are shown in greater detail in FIGS. 4a, 4b and 4c, respectively. Between each of the contact pins 30, 30' and 30" is an insulating spacer 26 identical to that shown in FIG. 3.

The only difference between the three contact pins 30, 30' and 30" is the position of the top post 20. These different positions of post 20 enable posts 20 to be staggered when they protrude through insulating board 22 in FIG. 1 to provide greater spaces between adjacent posts 20. If crowding of the contact pins 30 were not a problem, each contact pin 30 in the test clip 10 of FIG. 1 may be identical.

Spacers 26 and the various contact pins 30 are retained in position by a dowel 38. Additional details of the internal structure of the test clip 10 will be described later with respect to FIGS. 5 and 6.

A center assembly 42 of test clip 10 provides additional mechanical integrity to the test clip 10 and prevents contact pins 30 from rotating about dowel 38. Center assembly 42 will be described in detail later with respect to FIG. 6. The center assembly 42 is held together in the preferred embodiment using a screw 44.

To now position test clip 10 on integrated circuit package 14, a handle 48 of the test clip 10 is grasped manually, and the test clip 10 is centered over package 14. It is also foreseeable that a machine may manipulate test clip 10 in position by grasping handle 48 or its equivalent.

In the embodiment of FIG. 1, a clamping bar 56 is connected to handle 48 via upper clamping assembly 58. Lifting of handle 48 also lifts clamping bar 56 so that clamping bar 56 does not ride over rounded projections 60 extending from each spacer 26. In one embodiment, similar projections 60 are formed on each of the contact pins 30 as shown in FIGS. 4a–4c. When handle 48 and clamping bar 56 are lifted, as shown in FIG. 1, spacers 26 are rotate away from the center portion of the test clip 10 in the direction of arrow 62. This will allow the spacers 26 to clear the sides of the integrated circuit package 14.

The test clip 10 is then placed over integrated circuit package 14, using an index marker 64 on integrated circuit package 14 to insure that the orientation of the test clip 10 is proper.

Figure 2:
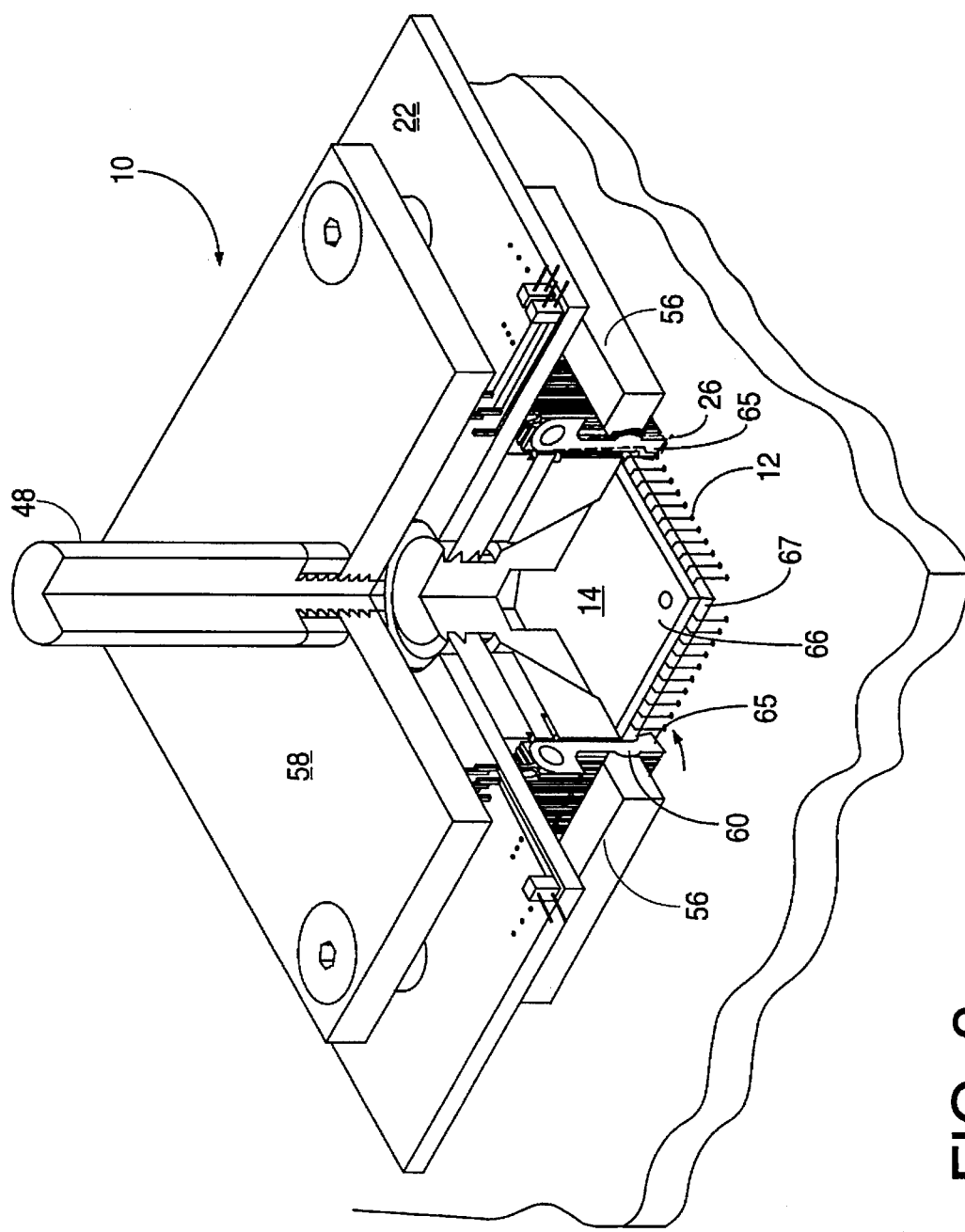
FIG. 2 is an isometric view of the test clip of FIG. 1 now secured to the integrated circuit package of FIG. 1.

Shown in FIG. 2 is the test clip 10 after being positioned on top of integrated circuit package 14 and after upper clamping assembly 58 has been pressed down to cause clamping bar 56 to ride over projections 60 on spacers 26 so as to cause an L-shaped portion 65 of spacers 26 to be inserted underneath the integrated circuit package 14.

Typically, plastic packages are formed to have a top half 66 and a bottom half 67 which are then sandwiched together to encapsulate the silicon chip and wire leads. For ease of manufacturing, the two halves are formed to have bevelled sides such that the completed package has sides which angle inward below where the pins 12 extend from the package. The L-shaped portions 65 of spacers 26 which are urged against these inwardly angled sides of integrated circuit package 14 cause test clip 10 to be firmly clamped to the package 14.

The pressing down of handle 48 and upper clamping assembly 58 also causes clamping bar 56 to ride over projections 60 on contact pins 30 so as to urge the contact pins 30 against the associated integrated circuit package pins 12. This increases the electrical contact between pins 30 and pins 12 as well as more firmly secures test clip 10 to package 14.

When test clip 10 is to be removed from integrated circuit package 14, handle 48 is simply pulled up to disengage clamping bar 56 from the projections 60 on the spacers 26 and contact pins 30 so as to allow test clip 10 to be easily lifted off package 14. In this way, little mechanical stress is imparted to the integrated circuit package 14 when either securing test clip 10 to package 14 or removing test clip 10 from package 14.

The construction of the test clip 10 will be discussed in more detail with respect to FIGS. 5–8.

Figure 5:
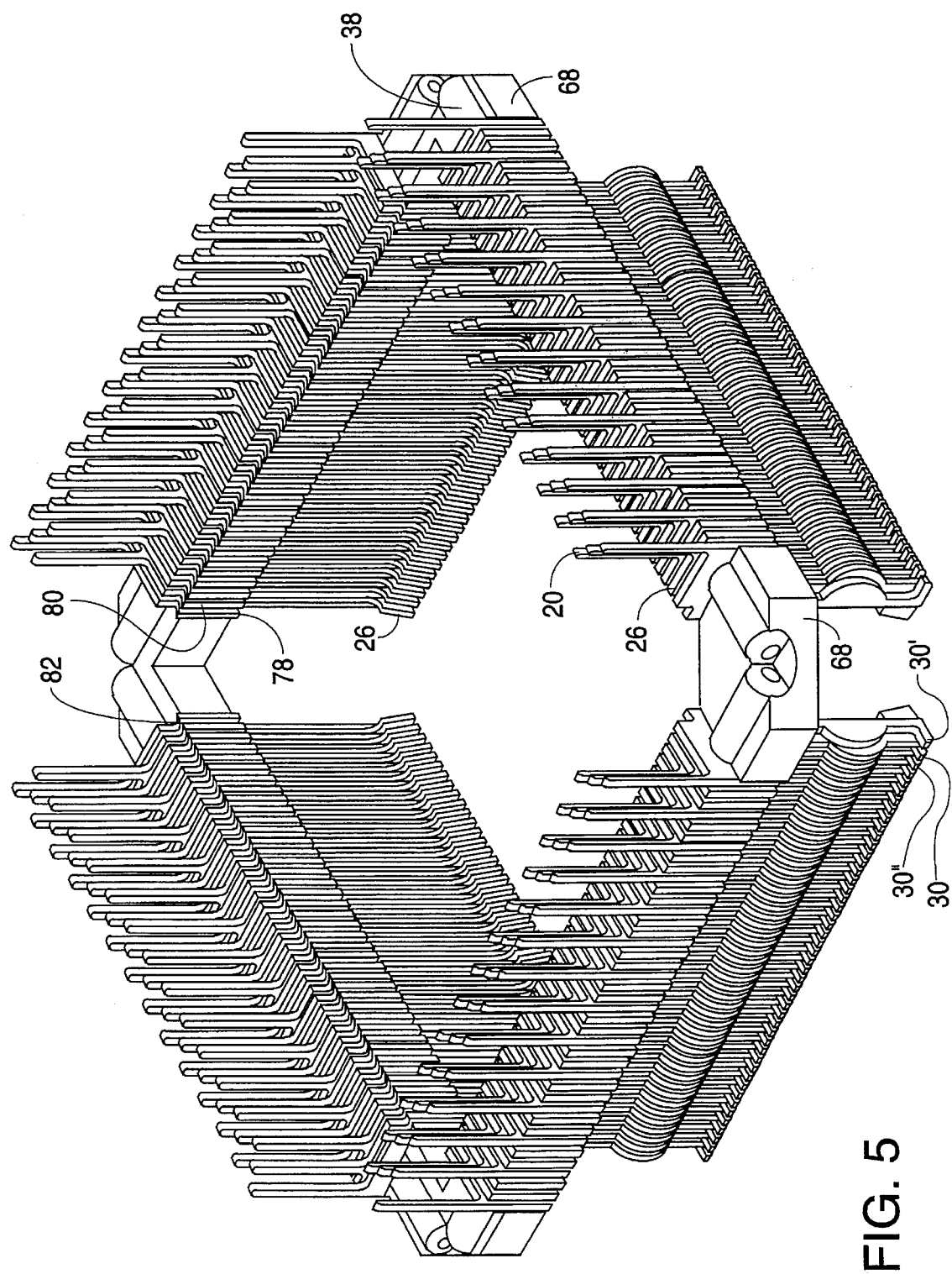
FIG. 5 illustrates a portion of the structure of the test clip of FIG. 1 which secures the linear arrays of contact pins and spacers in place with respect to one another.

FIG. 5 illustrates how contact pins 30 and spacers 26 are arranged on dowels 38 and how the three forms of contact pins 30, 30', and 30", shown in greater detail in FIGS. 4a–4c, are arranged so as to stagger the posts 20 to achieve a high density of posts 20 exposed through board 22 (shown in FIG. 1).

As shown in FIG. 5, four separate linear arrays of contact pins 30/spacers 26 are arranged on four dowels 38. A portion of a dowel 38 extends from the ends of each of the arrays. The ends of the dowels 38 are secured within a groove of a plastic retainer 68. Plastic retainer 68 is formed so that two grooves intersect at a 90° angle. In this way, four retainers 68 are required to retain the four sets of linear arrays of contact pins 30/spacers 26 in a rectangle or square shape. Preferably, the grooves in the retainer 68 are such that the round dowels 38 may simply be snapped into place within the grooves and held in place by the resiliency of the plastic retainer 68. Retainer 68 also acts to press contact pins 30 and spacers 26 together so that the separation between adjacent contact pins 30 equals the thickness of the spacer 26 sandwiched therebetween.

The assembly of FIG. 5 can be easily formed to any dimensions, by selecting the appropriate length dowels 38, and with any desired spacing of contact pins 30. Therefore, custom test clip sizes may be easily and quickly assembled.

Figure 6:
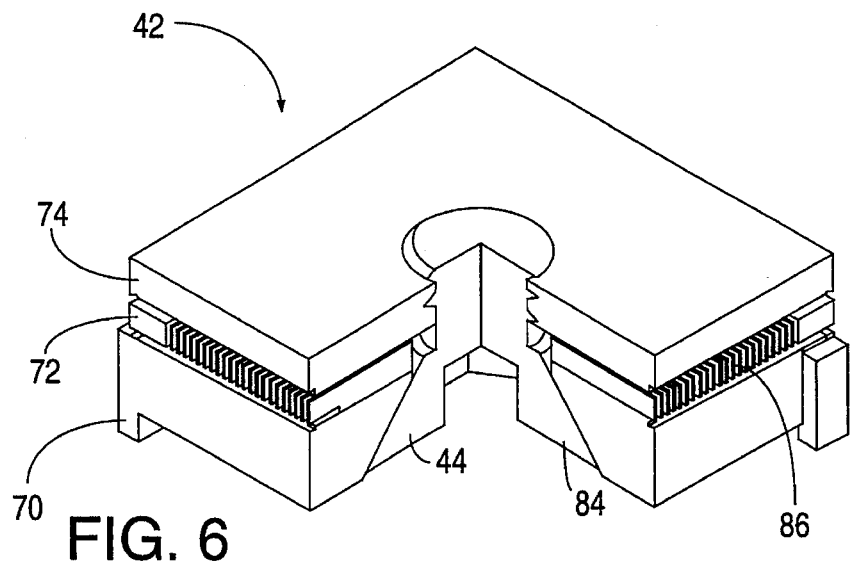
FIG. 6 is an isometric view of a center assembly of the test clip of FIG. 1 which is to be fitted within the opening of the structure of FIG. 5 to provide structural integrity to the test clip and maintain the relative positions of the various contact pins and spacers.

FIG. 6 is a center assembly 42 of the test clip 10 which coacts with the assembly of FIG. 5 to secure the contact pins 30 in place and to increase the overall mechanical integrity of the test clip 10. The center assembly 42 of FIG. 6 is formed of three separate plastic pieces comprising a base 70, a middle portion 72, and a top plate 74, each of which may be injection molded using conventional means.

Base 70 is positioned inside of the assembly shown in FIG. 5 so that a top surface of the base 70 abuts the shelf portion 75 of the contact pins 30 shown in FIGS. 4a–4c.

Middle portion 72 is then placed within the square opening in the assembly of FIG. 5 so that the perimeter walls of middle portion 72 substantially abut the opposing edges 76 of the contact pins 30 and spacers 26.

Top plate 74 is then positioned on top of middle portion 72 so as to abut against the upper shelf portions 82 of contact pins 30.

The three layer center assembly 42 is then tightly secured together, using a center screw 44 to clamp the top plate 74 and base 70 together onto the opposing shelf portions 82 and 75 of the contact pins 30, so as to prevent contact pins 30 from rotating about dowel 38.

In the embodiment shown in FIG. 6, the middle portion 72 is formed to have grooves 86 for providing a rough alignment and spacing of contact pins 30. The edges 76 of the contact pins 30 are inserted into an associated narrow groove 86. These grooves 86 are not necessary, however, due to the use of spacers 26. Additionally, if the pitches between contact pins 30 are small (e.g., less than 0.5 mm), then injection molding of the narrow grooves 86 would be unduly difficult. Thus, in an alternative embodiment, grooves 86 are not incorporated into the middle portion 72.

In an alternative embodiment, base 70 and middle portion 72 are formed as a unitary member in an injection molding process. This would reduce the cost of the resulting test clip 10 and ease the assembly of the test clip 10. In another embodiment, the middle portion 72 may be deleted altogether.

After the center assembly 42 of FIG. 6 is secured to the contact pin assembly of FIG. 5, a suitable printed circuit board 22, shown in FIG. 1, is then positioned over the posts 20 so that posts 20 extend through holes in board 22. Posts 20 may then be soldered or otherwise electrically connected to traces or other conductors on board 22 which lead to another set of pins 16 for connection to a tester. Board 22 may be any suitable structure, as would be known to one of ordinary skill in the art, which would enable posts 20 to be electrically connected to leads of a tester. It can be easily envisioned how board 22 may be eliminated altogether and a suitable connector may be directly connected to posts 20.

Figure 8:
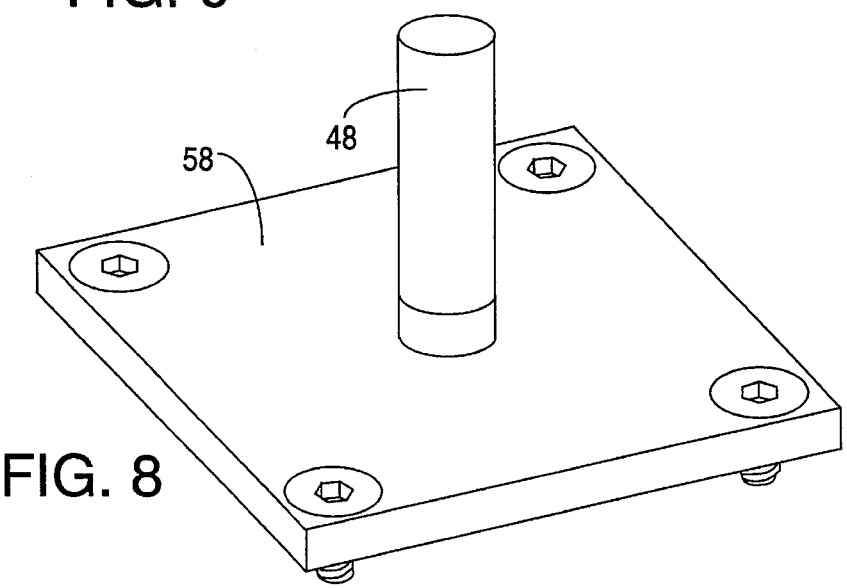
FIG. 8 is a second portion of the push clamp assembly which enables one to manipulate the test clip.
Figure 7:
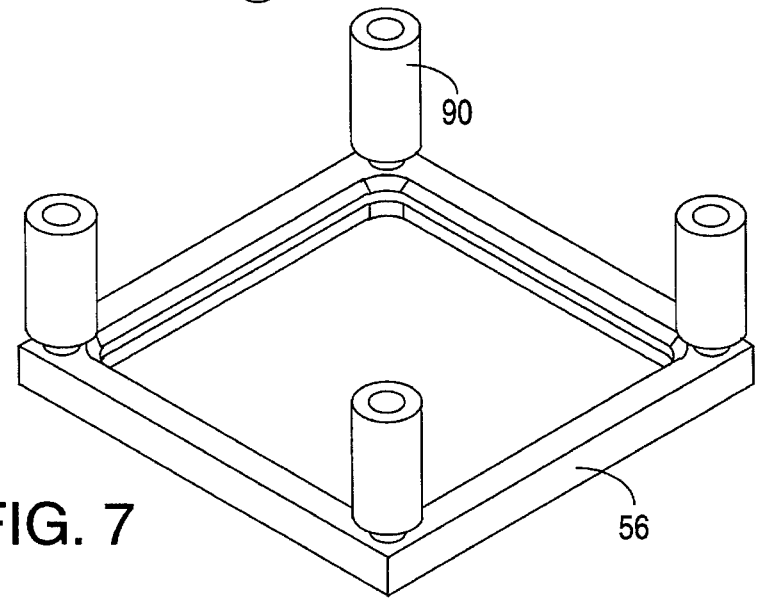
FIG. 7 is an isometric view of a portion of a push clamp assembly which circumscribes the pins and spacers shown in FIG. 5 and is used to urge the spacers toward the sides of the integrated circuit package to clamp onto the package.

FIG. 7 illustrates clamping bar 56, which connects to upper clamping assembly 58, shown in FIG. 8, by means of a suitable threaded connector 90. As shown in FIG. 1, threaded connector 90 is inserted through four relatively large holes in board 22 so that upper clamping assembly 58 and clamping bar 56 may move up and down relative to board 22 and pins 30. As would be understood, there are many other suitable configurations which would provide a means to raise and lower clamping bar 56 with respect to the projections 60 on the spacers 26 and contact pins 30.

If package 14 were not formed with inwardly angled sides but with flat sides, such as in the case with ceramic packages, then L-shaped portions 65 of spacers 26 would be urged against the flat sides of the package and a secure frictional grip would result.

Test clip 10 may be modified, if desired, to eliminate projections 60 on spacers 26 and on pins 30, and eliminate clamping bar 56. With these modifications to test clip 10, test clip 10 may then be directly pressed onto the top of package 14 so that the contact pins 12 contact the various pins 102. In this embodiment, spacers 26 remain substantially stationary. The resiliency of the metal contact pins 30 enables pins 30 to adapt to relatively large variations in the shape of pins 12.

Accordingly, the structure of test clip 10 and its method of operation have been completely described with respect to FIGS. 1–8. The size of the test clip 10 and the contact pin 30 configuration would, of course, depend on the specific integrated circuit package 14 to be tested.

FIG. 9 illustrates a conventional surface mounted package 100 which is generally designed to lay flat against a surface of a printed circuit board and whose terminals 102 are soldered to flat pads formed on the circuit board. An index marker 110 on package 100 enables the user to properly orient the package 100 on a printed circuit board.

A second embodiment of a test adapter is shown in FIG. 10 as contact pin/spacer assembly 120. Assembly 120 has a contact pin 130 arrangement which corresponds to a bonding pad arrangement on a conventional printed circuit board. The bonding pad arrangement would correspond to a terminal footprint pattern of an integrated circuit package, such as the surface mounted package 100 in FIG. 9, intended to be mounted on the printed circuit board.

The contact pins 130 are soldered (or equivalently connected) to the corresponding bonding pads on the printed circuit board so that the assembly 120 acts as an adapter between the bonding pads and a tester.

A suitable female connector leading to a tester may directly connect to the various posts 110 or, alternatively, a board, such as board 22 in FIG. 1, may be used to interface posts 110 with another type of connector.

The center assembly 126 of assembly 120 may be identical to center assembly 42 described with respect to FIG. 6. This center assembly 126 is designed to simply retain the four linear arrays of contact pins 130 and spacers 132 in their relative positions and to provide mechanical integrity to the resulting structure. A screw 134 is used in the embodiment of FIG. 10 to secure a base 136 to a top plate 138 so as to sandwich an extending portion 140 (see FIGS. 12a–12c) of each contact pin 130 therebetween. This prevents contact pins 130 from rotating and provides additional mechanical integrity to the resulting structure.

In the embodiment shown in FIG. 10, there is no middle portion between base 136 and top plate 138, and both the base 136 and top plate 38 are supported solely by the extending portions 140 of contact pins 130. In an alternative embodiment, a middle portion, similar to middle portion 72 in FIG. 6, may also be used.

Since spacers 132 are not required to latch on to an integrated circuit package, spacers 132 may be formed to have virtually any shape, such as the trapezoidal shape shown in FIG. 11. These spacers 132 may be formed using methods identical to that previously described, where spacers 132 are simply stamped out of a sheet of insulating material, such as plastic. The thickness of spacers 132 may be virtually any thickness and can be reliably controlled down to approximately one mil tolerance. The prior art spacers which are injection molded could not be formed to this tolerance and could not be formed thin enough for many of the high density terminal configurations of state of the art integrated circuits.

FIGS. 12a, 12b, and 12c illustrate three shapes of contact pins 130, which are identified as 130, 130' and 130", respectively.

The portion of pins 130 which is sandwiched between base 136 and top plate 138 is identified in FIG. 12a as portion 140.

As in FIG. 1, a dowel 144 is inserted through the hole formed in the spacers 132 and contact pins 130. The ends of these dowels 144 are secured in a groove formed in a plastic retainer 148, similar to retainer 68 in FIG. 5. The grooves are provided at 90° angles, so that four linear arrays of contact pins 130 and spacers 132 may be secured together in a rectangle or square configuration.

FIG. 13 illustrates a third embodiment of a test clip 200. The primary difference between test clip 200 of FIG. 13 and test clip 10 of FIG. 1 is that test clip 200 uses a clamping screw 204 to raise and lower an inner clamping structure 206a/206b to control the pivoting of spacers 202 about bar 208, while test clip 10 of FIG. 1 uses a handle 48 to raise and lower an outer clamping bar 56 to control the pivoting of spacers 26 about dowel 38. Otherwise, the overall operation of the test clips 10 and 200 are similar in that a movable clamping means is used to control the angle of the spacers, where the spacers are individually formed and supported by a bar.

The embodiment of test clip 200 shown in FIG. 13 has an advantage over test clip 10 shown in FIG. 1 in that a printed circuit board, such as circuit board 22 in FIG. 1, secured over the top surface of test clip 200 may contain centrally located connector terminals for connection to a compatible tester connector. In the embodiment of test clip 10 of FIG. 1, the central part of circuit board 22 is blocked by clamping assembly 58 and handle 48.

A detailed construction of test clip 200 will be described with respect to FIGS. 13 through 22.

The body of test clip 200 consists of a stationary top body portion 210 and a stationary bottom body portion 212 secured together using socket head cap screws 214.

A cavity 216 is defined between top body portion 210 and bottom body portion 212 in which a movable clamping structure 206a/206b is moved up and down within the body of test clip 200 by the rotation of clamping screw 204.

Test clip 200 is shown in FIG. 13 as being in its open or unclamped state, where clamping structure 206a/206b is in its downward position within cavity 216 of test clip 200. Moving clamping structure 206a/206b upward pushes projection 220a on spacers 202 upward, thereby causing the spacers 202 to rotate and the lower portion 218 of spacers 202 to pivot inward about bar 208 to be in a clamping position. Moving clamping structure 206a/206b downward presses down on projection 220b, thereby causing the spacers 202 to rotate and the lower portion 218 of spacers 202 to pivot outward about bar 208 to be in an unclamped position.

In FIG. 13, spacers 202 are shown in various phantom positions to illustrate the pivotability of spacers 202 around bar 208.

Spacers 202 are preferably formed of the same material as spacers 26 described with respect to test clip 10 in FIG. 1. The shape of spacers 202 is different than the shape of spacers 26 in FIG. 1 in that spacers 202 do not have outside projections 60 (FIG. 3), and spacers 202 rotate around a double D-shaped bar 208, with two rounded opposing sides, rather than a cylindrical dowel 38 (FIG. 1).

FIG. 13 also reveals the top portion of test clip contact pins 222, which are located on the four sides of test clip 200. Contact pins 222 are preferably formed of the same material as contact pins 30 used in test clip 10. As with contact pins 30 in test clip 10, the contact pins 222 in test clip 200 make use of staggered posts 224 to provide a maximum of spacing between adjacent posts 224.

The arrangement of contact pins 222 around the periphery of test clip 200 match the terminal 228 footprint pattern of integrated circuit package 230 so that, when test clip 200 is properly mounted on package 230, a tester connector can interface with terminals 228 via a printed circuit board connected to posts 224.

To pivot spacers 202 around bar 208 to clamp or unclamp test clip 200 to or from package 230, clamping screw 204 is rotated, using a suitable hex socket wrench or the like, to raise or lower clamping structure 206a/206b. This would cause the lower portion 218 of spacers 202 to engage or disengage the sides of the package 230, as shown in FIGS. 14b and 15b. Although clamping screw 204 is shown having a hex head, any other suitable head, including a slotted, Phillips, or fixed wing-nut type head, would also suffice.

A top stationary screw 232 is loosely fitted within an axial cavity in clamping screw 204, as shown in the partial cross-section of FIG. 13. Stationary screw 232 is tightly screwed into internal threading of a bottom stationary screw 234, which is loosely fitted through a hole in bottom body portion 212. Stationary screw 234 is threaded into portion 206b of the clamping structure, and the head of stationary screw 234 is fixed tightly against portion 206a of the clamping structure. Thus, top stationary screw 232, bottom stationary screw 234, and clamping structure 206a/206b move together up and down with respect to the top and bottom body portions 210, 212 of test clip 200.

Clamping screw 204 is relatively loosely threaded through the stationary top body portion 210 of test clip 200. Upon rotation of clamping screw 204 in a clockwise direction, clamping screw 204 will move in a downward direction relative to top body portion 210. Clamping screw 204 has a downward facing shelf portion 236 which abuts and pushes down on the end of bottom stationary screw 234 to cause bottom stationary screw 234 to also move in a downward direction relative to top body portion 210 and bottom body portion 212. This downward movement of stationary screw 234 causes clamping structure 206a/206b and top stationary screw 232 to also move downward. This downward movement of clamping structure 206a/206b, in turn, causes the lower portion 218 of spacers 202 to pivot outward about axis 208 so as to be in an unclamped position, as shown in FIG. 13.

FIG. 14a shows test clip 200 being positioned over package 230, where spacers 202 are in their unclamped position.

FIG. 14b is a partial side view of the cut away portion in FIG. 14a which illustrates in detail the interaction of the clamping structure 206a/206b and spacer 202. In FIG. 14b, the stationary test clip 200 body comprising top body portion 210 and bottom body portion 212 is not shown for simplicity.

In the unclamped position shown in FIG. 14b, a peripheral portion of clamping structure 206a/206b is pushing down on bottom projection 220b of spacer 202, causing spacer 202 to pivot in the counterclockwise direction about bar 208.

In order to allow spacers 202 to rotate while maintaining a constant pressure contact between the clamping structure portion 206a and projections 220a and 220b on spacer 202, a rounded projection 238 is provided on the top surface of clamping structure portion 206a which contacts projection 220a despite the changing angles that spacer 202 makes with respect to clamping structure portion 206a.

FIG. 15a illustrates test clip 200 in its clamped state, where spacers 202 engage the sides of package 230. A side view of the cut away portion of FIG. 15a is shown in FIG. 15b, illustrating how the lower portion 218 of spacer 202 clamps the lower side portion of package 230 when clamping structure 206a/206b is moved upwardly to pivot spacer 202 in a clockwise direction around bar 208.

As shown in FIG. 15a, clamping screw 204 is rotated in a counterclockwise direction to move clamping screw 204 upward with respect to top body portion 210. The upper shelf 240 of clamping screw 204 pushes up on an abutting bottom shelf of top stationary screw 232 so that stationary screws 232 and 234, as well as clamping structure 206a/206b, are caused to lift up as clamping screw 204 is turned in a counterclockwise direction.

FIG. 16 is a close-up, cut away view of the central portion of test clip 200 in FIG. 13 for showing the operation of the internal clamping mechanism. The various arrows shown in FIG. 16 illustrate how when clamping screw 204 is turned clockwise, shelf 236 of clamping screw 204 pushes down on the end portion of bottom stationary screw 234 to cause clamping structure 206a/206b to move downward, thereby causing spacers 202 to pivot outwardly to their unclamped positions.

FIG. 16 also illustrates how top stationary screw 232 is fixed in position with respect to bottom stationary screw 234. Bottom stationary screw 234 is provided with a minimum of three rotations of inner threads so that when top stationary screw 232 is screwed into the central threaded area of bottom stationary screw 234, top stationary screw 232 is solidly secured to bottom stationary screw 234 after about three turns of top stationary screw 232.

FIG. 17 is a perspective view of test clip 200 as it may actually appear without any cut away portions.

FIGS. 18–22 show the various components used to form the test clip 200.

FIG. 18 shows four plastic bars 208 which are substantially rectangular with two rounded edges to facilitate limited pivoting of spacers 202 when inserted on bars 208.

FIGS. 19a, 19b, and 19c show the three designs of contact pins 222 used in test clip 200, where posts 224 are positioned at three different locations on contact pins 222. The opening 244 in each of contact pins 222 matches the shape of bar 208 so that contact pins 222 fit onto bar 208 with a minimum of rotational play.

FIG. 20 shows a plastic spacer 202 which is preferably stamped or water-cut from a thin plastic sheet, as previously described. One or more spacers 202 are interposed between adjacent contact pins 222 to cause contact pins 222 to align with the terminals 228 on an integrated circuit package 230. Hole 246 formed in spacer 202 has upper and lower flat portions which cause hole 246 to be slightly larger than the dimensions of a bar 208. This enables spacer 202 to have some rotational play about bar 208, as illustrated in FIG. 13.

Once the four bars 208 are provided with the proper arrangement of contact pins 222 and spacers 202, the ends of bars 208 are then placed in respective retaining channels 248 of bottom body portion 212 shown in FIG. 21.

Next, a plastic portion 206a of movable clamping structure 206a/206b is set in a central portion of bottom body portion 212. The rounded top portion 238 of clamping structure 206a is shown in FIG. 21.

To provide mechanical strength to the clamping structure portion 206a, a metal plate 206b is then provided in the central well area of plastic portion 206a. Metal plate 206b has a central thread 250 which matches the thread on bottom stationary screw 234.

A top body portion 210 is then positioned over bottom body portion 212 and secured in place using socket head cap screws 214. Top body portion 210 has a central thread 252 which matches the thread of clamping screw 204.

Bars 208, retaining the linear array of contact pins 222 and spacers 202, are now locked in place between top body portion 210 and bottom body portion 212.

Screws 232, 204, and 234 are then threaded into their respective threads as shown in FIG. 13. The resulting structure is shown in FIG. 17.

In another embodiment of a test clip for clamping onto a package 230, contact pins 222 may be formed to pivot about bar 208 like spacers 202 in FIG. 13 and be provided with projections 220a and 220b so that the contact pins 222 may be urged toward terminals 228 on a package 230 when test clip 200 is clipped to the package 230. This would provide a more reliable electrical contact between pins 222 and their respective terminals 228.

If test clip 200 is to be used as a surface mount, where contact pins 222 are to be soldered directly to pads on a printed circuit board, then the internal clamping structure 206a/206b of test clip 200 is not necessary, and any pivoting of spacers 202 would be undesirable. Test clip 200 shown in FIG. 13 may be easily converted to a surface mount device by using spacer 254, shown in FIG. 23, instead of spacer 202. Spacer 254 does not include the L-shaped lower portion 218 (FIG. 14b) which was used to clamp onto a side of a package 230. Additionally, spacer 254 does not include top and bottom projections 220a, 220b (FIG. 14b), since it is not required to be pivoted around bar 208. Additionally, the hole 256 in spacer 254 is made to be the same size as the hole 244 in contact pins 222 to prevent any significant rotational play of spacer 254 around bar 208.

Since in any surface mounted design there is no need for clamping, the clamping structure 206a/206b in FIG. 13 may be deleted altogether as well as screws 204, 232, and 234.

Thus, four general configurations of test adapters (two test clips and two surface mount devices) have been described.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A test adapter for an integrated circuit package already mounted on a printed circuit board comprising:
   one or more linear arrays of test clip contact pins having electrically insulating spacers therebetween, said contact pins configured for physically contacting exposed terminals extending from a single integrated circuit package already mounted on a printed circuit board, each of said spacers being formed as a separate piece, said spacers spacing said contact pins from one another such that the spacing between adjacent ones of said contact pins causes said contact pins to align with terminals of said integrated circuit package.

2. The test adapter of claim 1 wherein said spacers are formed by stamping out said spacers from a flat sheet of insulating material.

3. The test adapter of claim 1 wherein each of said linear arrays of said contact pins and said spacers are retained in linear alignment by an elongated member extending through a hole formed in each of said contact pins and spacers.

4. The test adapter of claim 3 further comprising retaining means for attachment to ends of said elongated members to secure said one or more linear arrays in position relative to one another.

5. The test adapter of claim 4 wherein said retaining means comprises means to retain four of said linear arrays in a rectangular structure.

6. The test adapter of claim 1 further comprising a movable clamping structure which is configured to urge said spacers toward a side of said integrated circuit package when said test adapter is positioned over said integrated circuit package so as to cause said test adapter to grip said integrated circuit package.

7. The test adapter of claim 6 wherein said spacers include projections, and wherein said movable clamping structure is configured to contact said projections on said spacers to urge said spacers toward said side of said integrated circuit package when said clamping structure is operated to cause said test adapter to grip said integrated circuit package.

8. The test adapter of claim 6 wherein said spacers include a generally L-shaped portion which is inserted underneath said integrated circuit package when said spacers are urged toward said side of said integrated circuit package for gripping said integrated circuit package.

9. The test adapter of claim 6 wherein said spacers and said clamping structure are configured so that lifting of said clamping structure causes said spacers to be moved away from said side of said integrated circuit package.

10. The test adapter of claim 6 further comprising a screw means connected to said clamping structure, where turning of said screw means lifts up or pushes down said clamping structure.

11. The test adapter of claim 1 further comprising a movable clamping structure which is configured to contact projections on said contact pins to urge said contact pins toward terminals of said integrated circuit package to increase a contact pressure between said contact pins and said terminals of said integrated circuit package.

12. The test adapter of claim 1 wherein each of said contact pins are connected to terminals on said test adapter for connection to a tester.

13. A test adapter for an integrated circuit package already mounted on a printed circuit board comprising:
   a plurality of linear arrays of test adapter contact pins with insulating spacers therebetween, said contact pins configured for physically contacting exposed terminals extending from a single integrated circuit package already mounted on a printed circuit board, each of said spacers being formed as a separate piece, said spacers spacing said contact pins from one another such that the spacing between adjacent ones of said contact pins causes said contact pins to align with terminals of said integrated circuit package;
   an elongated member extending through a hole formed in said contact pins and said spacers for retaining said contact pins and said spacers in linear alignment; and
   a retaining means for securing each of said linear arrays together at a 90° angle with respect to one another.

14. The test adapter of claim 13 further comprising a movable clamping structure which is configured to urge said spacers toward a side of said integrated circuit package when said test adapter is positioned over said integrated circuit package so as to cause said test adapter to grip said integrated circuit package.

15. The test adapter of claim 14 wherein said spacers include projections, and wherein said movable clamping structure is configured to contact said projections on said spacers to urge said spacers toward said side of said integrated circuit package when said clamping structure is operated to cause said test adapter to grip said integrated circuit package.

16. The test adapter of claim 14 wherein said spacers include a generally L-shaped portion which is inserted underneath said integrated circuit package when said spacers are urged toward said side of said integrated circuit package for gripping said integrated circuit package.

17. The test adapter of claim 14 wherein said spacers and said clamping structure are configured so that lifting of said clamping structure causes said spacers to be urged away from said side of said integrated circuit package.

18. The test adapter of claim 14 further comprising a handle means connected to said clamping structure, said handle means being used to lift up or push down said clamping structure.

19. The test adapter of claim 14 further comprising a screw means connected to said clamping structure, where turning of said screw means lifts up or pushes down said clamping structure.

20. The test adapter of claim 13 further comprising a movable clamping structure which is configured to contact projections on said contact pins to urge said contact pins toward terminals of said integrated circuit package to increase a contact pressure between said contact pins and said terminals of said integrated circuit package.

21. The test adapter of claim 13 wherein each of said contact pins are connected to terminals on said test adapter for connection to a tester.

* * * * *